(12) United States Patent
Braun et al.

(10) Patent No.: US 6,504,747 B2
(45) Date of Patent: Jan. 7, 2003

(54) INTEGRATED MEMORY WITH PLATE LINE SEGMENTS

(75) Inventors: Georg Braun, München (DE); Heinz Hönigschmid, Pöcking (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 09/792,796

(22) Filed: Feb. 23, 2001

(65) Prior Publication Data

US 2001/0030894 A1 Oct. 18, 2001

(30) Foreign Application Priority Data

Feb. 23, 2000 (DE) .......................................... 100 08 243

(51) Int. Cl.[7] .............................................. G11C 11/22
(52) U.S. Cl. .................. 365/145; 365/149; 365/230.06; 365/189.02
(58) Field of Search ................................ 365/145, 149, 365/230.06, 189.02

(56) References Cited

U.S. PATENT DOCUMENTS

| | | | |
|---|---|---|---|
| 4,593,382 A | 6/1986 | Fujishima et al. | 365/149 |
| 5,373,463 A | 12/1994 | Jones Jr. | 365/145 |
| 5,400,275 A * | 3/1995 | Abe et al. | 365/145 |
| 5,424,976 A | 6/1995 | Cuppens | 365/145 |
| 5,598,366 A | 1/1997 | Kraus et al. | 365/145 |
| 5,936,887 A | 8/1999 | Choi et al. | 365/185.17 |
| 5,991,188 A | 11/1999 | Chung et al. | 365/145 |
| 6,366,490 B1 * | 4/2002 | Takeuchi et al. | 365/145 |

FOREIGN PATENT DOCUMENTS

| | | |
|---|---|---|
| EP | 0 724 265 A2 | 7/1996 |
| EP | 0 938 096 A2 | 8/1999 |

OTHER PUBLICATIONS

ISSCC94, Digest of Technical Papers, p. 269, Feb. 18, 1994.
Tatsumi Sumi et al.: A 256kb Nonvolatile Ferroelectric Memory at 3V and 100ns, ISSCC94, 1994 IEEE International Solid–State Circuits Conference, pp. 268–269; p. 350; pp. 208–209; p. 315.

* cited by examiner

Primary Examiner—David Nelms
Assistant Examiner—Connie C. Yoha
(74) Attorney, Agent, or Firm—Laurence A. Greenberg; Werner H. Stemer; Gregory L. Mayback

(57) ABSTRACT

The integrated memory has driver units DRVi, via which the column select lines CSLi are connected to the plate line segments PLi and which, as a function of the potential of the associated column select lines CSLi and the word addresses RADR on the plate line segments PLi connected to them, generate potentials which have defined values for each operating state of the memory.

5 Claims, 4 Drawing Sheets

MUXL=WL0∨WL1∨...∨WL127
MUXR=WL128∨WL129∨...∨WL255

INTEGRATED MEMORY WITH PLATE LINE SEGMENTS

The invention relates to an integrated memory having plate line segments.

BACKGROUND OF THE INVENTION

A memory of this type is described in U.S. Pat. No. 5,424,976 A. This memory is a ferroelectric memory of the FRAM type (ferroelectric random access memory). The memory cells of an FRAM are constructed in exactly the same way as memory cells of DRAMs (dynamic random access memories). In other words, each memory cell has a selection transistor and a storage capacitor, but in contrast to a DRAM, the storage capacitor has a ferroelectric dielectric.

FIELD OF THE INVENTION

The method of operation of such a memory will be roughly explained below with reference to the abovementioned U.S. Pat. No. 5,424,976 A. The memory cells are arranged at crossover points of bit lines, word lines and plate line segments. The selection of a plurality of memory cells assigned to a common column, which in each case has a plurality of the bit lines, is effected by activation of the associated word line and pulsing of the associated plate line segment. In this case, the plate line segments are connected via transistors functioning as switching elements to control lines, whose potential depends on column addresses present at the memory. The gates of the switching transistors are connected to that word line which is assigned to the memory cells of the respective plate line segment. It follows from this that the plate line is connected to the corresponding plate line segment when the associated word line is activated for selection of the corresponding memory cells. The switching transistor is in the on state in this case. Otherwise, the switching transistor is in the off state, so that the corresponding plate line segment is decoupled from the control line which has a defined potential. In the decoupled case, the plate line segments connected to one of the electrodes of the storage capacitors float, that is to say they do not have a defined potential.

SUMMARY OF THE INVENTION

The invention is based on the object of specifying an integrated memory of the type described which is less susceptible to faults than known memories.

The integrated memory according to the invention has driver units, via which the column select lines are connected to the plates line segments and which, as a function of the potential of the associated column select lines and the word addresses on the plate line segments connected to them, generate potentials which have defined values for each operating state of the memory.

The aforementioned features prevent the plate line segments from floating. Interfering influences on the plate line segments on account of crosstalk of lines, for example word lines, running parallel to the plate line segments are thereby prevented. Crosstalk can occur, in particular, in large scale integrated memories, in which the distances between the corresponding lines are particularly small. Since the potential of the plate line segments is always held at defined values both in the event of a selection of the memory cells connected to them and when the memory cells connected to them are not selected, there is no, or at least only very little, influencing of the potential of the segments on account of crosstalk. In the case of the memory according to the invention, the presence of defined potential values on the plate line segments in each operating state of the memory is achieved by the provision of the driver units. A driver unit generates an output signal which always assumes defined values as a function of input signals of the driver unit. U.S. Pat. No. 5,424,976 cited further above exhibits no driver units of this type, but merely switching transistors, which, in the off state, cause the plate line segments connected to them to float.

According to an advantageous development, the plate line segments run parallel to the bit lines and the memory has multiplexers each arranged electrically between one of the driver units and two of the plate line segments, the multiplexers connecting the driver units to one of the two associated plate line segments as a function of word addresses. In this development, then, one of the driver units is in each case assigned to two of the plate line segments via the associated multiplexer. Therefore, only a smaller number of driver units are necessary than if a separate driver unit were in each case provided per plate line segment. It goes without saying that a driver unit can also be assigned to a larger number of plate line segments via a corresponding multiplexer.

According to another development of the invention, the plate line segments are arranged in a first wiring plane and are isolated from one another by isolating regions in the direction of the word lines. Furthermore, line-shaped structures are provided which are arranged in a second wiring plane perpendicularly to the word lines at regular distances from one another. In this case, the bit lines are formed by those line-shaped structures which are arranged parallel to the plate line segments running in the first wiring plane, while those line-shaped structures which are arranged parallel to the isolating regions running in the first wiring plane are dummy structures connected to none of the memory cells.

In this development, the line-shaped structures arranged at regular distances in the second wiring plane ensure a uniform and thus technologically unproblematic production. In this case, however, not every line-shaped structure is utilized as bit line, but rather only those line-shaped structures which are assigned an associated plate line segment in the first wiring plane. The remaining line-shaped structures, which do not form bit lines, serve merely for simplifying the production process and are therefore what are called "dummy structures", which serve no electrical function at all in the completed integrated circuit.

In the development just described, it is particularly advantageous if there is arranged in the second wiring plane, parallel to each isolating region, in each case precisely a single one of the dummy structures, which isolates two groups of adjacent bit lines from one another. This solution thus provides relatively narrow isolating regions between the plate line segments, which are assigned, in the second wiring plane, only one of the line-shaped structures arranged at regular distances from one another. This results in the integrated memory having a construction that is as compact as possible.

DESCRIPTION OF THE PREFERRED EMBODIMENT

The invention is suitable for all memories which have [the features of the preamble of claim 1, that is to say] memory cells connected to bit lines, word lines and plate line segments. However, the invention is explained hereinafter only using exemplary embodiments which relate to integrated memories of the FRAM type.

Figure 1:
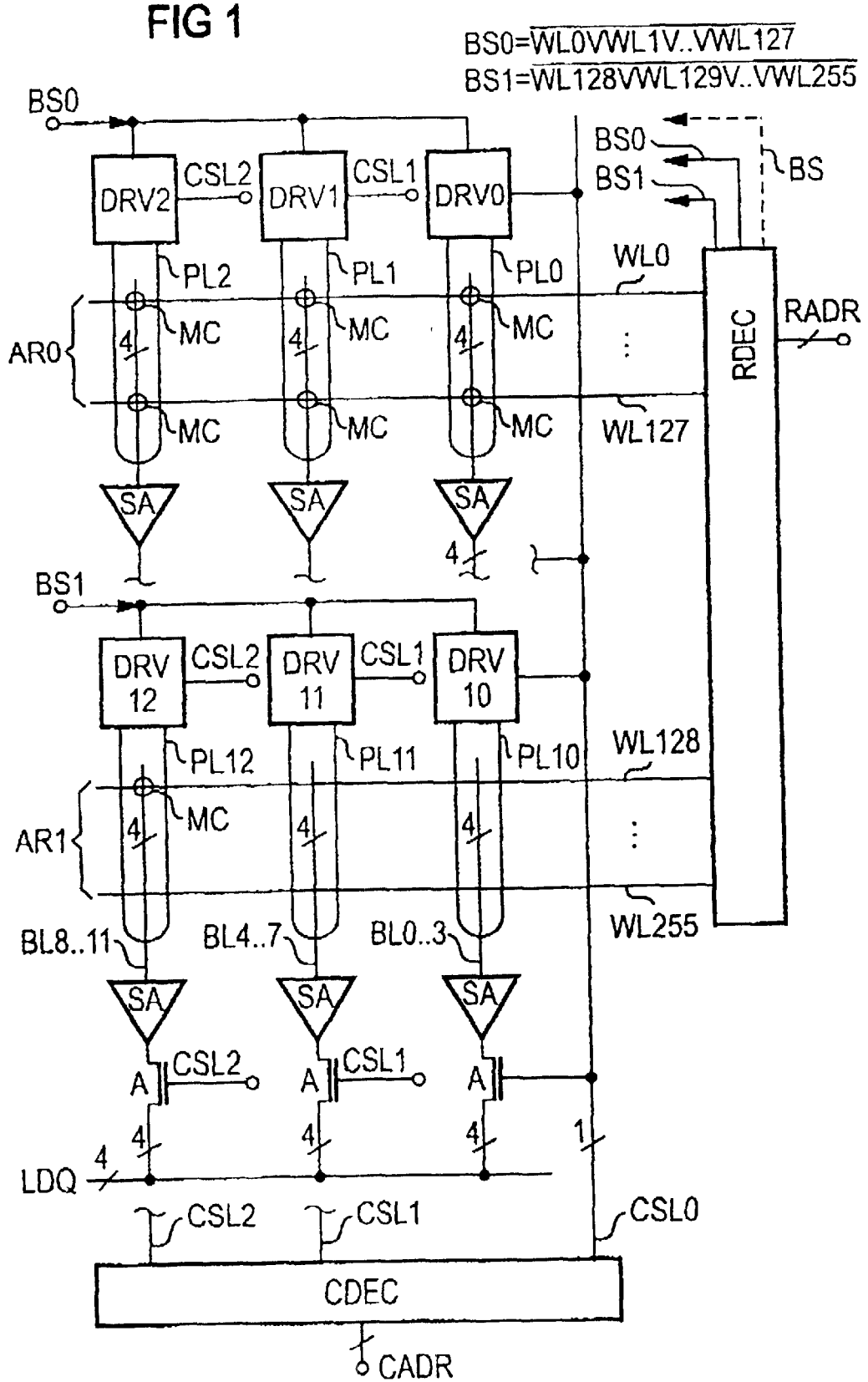
FIG. 1 shows a first exemplary embodiment of the integrated memory.

FIG. 1 shows an integrated memory having a column decoder CDEC, which activates column select lines CSLi as a function of column addresses CADR that are present, and having a row decoder RDEC, which activates word lines WLi as a function of row addresses RADR. The memory has memory cells MC which are arranged in cell arrays AR0, AR1 and are situated at crossover points of bit lines BLi, the word lines WLi and plate line segments PLi. The plate line segments PLi are depicted as widened strips in FIG. 1.

Figure 3:
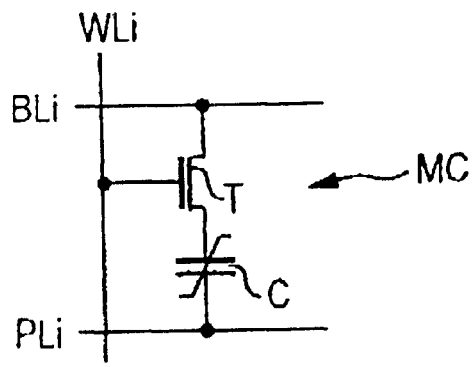
FIG. 3 shows a memory cell of the memory illustrated in FIG. 1.

FIG. 3 shows the construction of one of the memory cells MC from FIG. 1. It has a selection transistor T and a storage capacitor C having a ferroelectric dielectric. The bit line BL assigned to the memory cell MC is connected to one of the electrodes of the storage capacitor C via the controllable path of the transistor T. The other electrode of the storage capacitor C is connected to the plate line segment PLi assigned to the memory cell. The gate of the selection transistor T is connected to the associated word line WLi.

In the case of the memory in accordance with FIG. 1, four of the bit lines BL0 . . . 3, BL4 . . . 7, BL8 . . . 11 are in each case assigned to a common column. All four bit lines of a column can be selected via an associated one of the column select signals CSLi via transistors A. Each bit line BLi is connected via an associated sense amplifier SA and the corresponding transistor A to one of four local data lines LDQ, via which data can be transferred from and to a point outside the memory. The gates of the transistors A are connected to the corresponding column select line CSLi. In practice, each sense amplifier SA is in each case assigned two bit lines BLi, which form a common bit line pair. In order to simplify the illustration, in each case the second bit lines of each bit line pair have not been depicted in FIG. 1. Moreover, the transistors A and also the local data lines LDQ have been illustrated only for the lower memory cell array AR1.

In FIG. 1, the column select lines CSLi are connected via a respective driver unit DRVi to in each case one of the plate line segments PLi in each memory cell array ARi. In addition, a block select signal BS0, BS1 is fed to each driver unit DRVi. A respective block select signal BS0, BS1 is provided for each cell array AR0, AR1. The block select signals BS0, BS1 are likewise generated by the row decoder RDEC as a function of the row addresses RADR. In this case, the block select signal BS0 of the upper cell array AR0 corresponds to a logic NOR combination of the word line signals WL0 to WL127 assigned to this cell array AR0. Likewise, the block select signal BS1 assigned to the lower cell array AR1 is a logic NOR combination of the word line signals WL128 to WL25 assigned to this cell array AR1.

This means that the corresponding block select signal BS0, BS1 assumes a high level whenever none of the associated word lines WL0 to WL127 and WL128 to WL255, respectively, have a high level.

Figure 2:
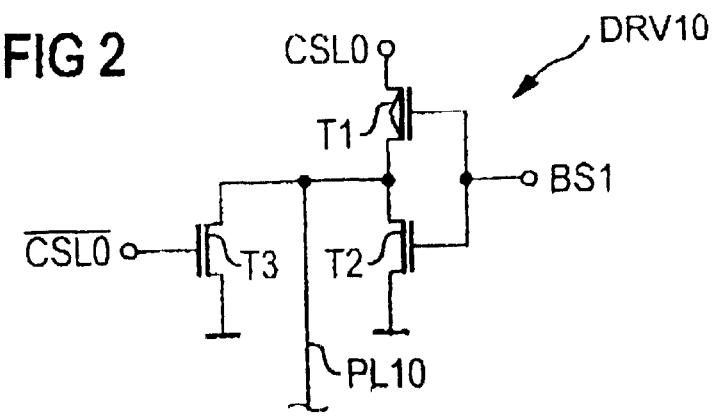
FIG. 2 shows a driver unit of the memory illustrated in FIG. 1.

FIG. 2 shows the construction of one of the driver units DRVi from FIG. 1. The driver unit DRV10 is illustrated by way of example, which driver unit is assigned to the lower cell array AR1 in FIG. 1. The associated column select line CSL0 is connected to the associated plate line segment PL10 via a first transistor T1 of the P-channel type. The plate line segment PL10 is additionally connected to ground via a second transistor T2 of the N-channel type. A third transistor T3 of the N-channel type is arranged in parallel with the second transistor T2. The gates of the first and second transistors T1 and T2 are connected to the associated block select signal BS1. The gate of the third transistor T3 is connected to an inverse column select line /CSL0.

The inverse column select line /CSL0 illustrated in FIG. 2 has not been depicted in FIG. 1 for reasons of clarity. Each of the column select lines/CSLi in FIG. 1 is respectively assigned such an inverse column select line/CSLi which runs parallel to it and has, at every point in time, a potential which is inverted relative to that of the associated column select line. In other exemplary embodiments of the invention, this inverted potential can also be generated locally in each memory cell array ARi, so that the inverse column select lines/CSLi can be dimensioned to be relatively short.

FIG. 2 reveals that a plate line segment PL10 has a high level only when the associated block select signal BS1 has a low level and the associated column select signal CSL0 has a high level. The block select signal BS1 has a low level precisely when one of the word lines WL128 to WL255 assigned to the corresponding cell array AR1 has a high level. In all other cases, i.e. if either the column select signal CSL0 has a low level or if the block select signal BS1 has a high level (this is the case precisely when none of the word lines WL128 to WL255 of the relevant cell array AR1 has been activated by the word line decoder RDEC), the plate line segment PL10 has a low level. At a low level of the plate line segment PL10, the memory cells MC connected thereto are not selected, and they are selected at a high level. This means that both in the event of selection and in the event of non-selection of one of the memory cells MC, the plate line segment connected thereto has a defined level and, consequently, never floats.

Figure 4:
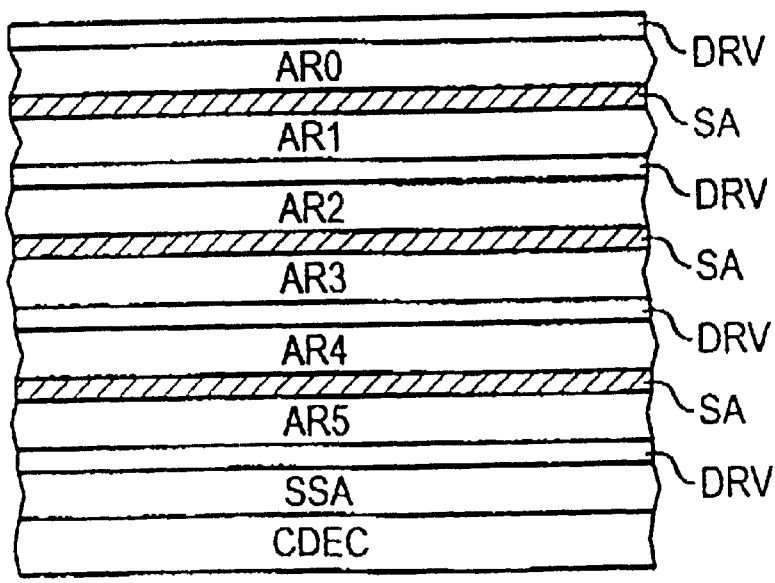
FIG. 4 shows the layout of a further exemplary embodiment of the memory according to the invention, in the illustration of a plurality of adjacent cell arrays.

FIG. 4 shows the layout of a further exemplary embodiment of the invention, of which five adjacent cell arrays AR0 to AR5 have been illustrated. In this exemplary embodiment, in each case two adjacent cell arrays AR0 and AR1, AR2 and AR3, and AR4 and AR5 utilize the same sense amplifier SA in each case ("shared sense amplifier concept"). The shared sense amplifier concept is already known to the person skilled in the art from DRAMs, for example. Also illustrated are the secondary sense amplifiers SSA, which serve for amplifying the data driven via the local data lines LDQ (see FIG. 1) from the sense amplifiers SA. In addition, FIG. 4 shows the arrangement of the column decoder CDEC, which serves for generating the column select signals CSLi which are fed via the corresponding select lines to all six cell arrays ARi. In the case of the memory in accordance with FIG. 4, some of the driver units DRV via which the column select lines CSLi are connected to the corresponding plate line segments PLi (see FIG. 1) are in each case assigned to two adjacent cell arrays AR1 and AR2, AR3 and AR4. The strips of the sense amplifiers SA and the strips of the driver units DRV are arranged alternately between respectively adjacent cell arrays ARi.

Figure 6:
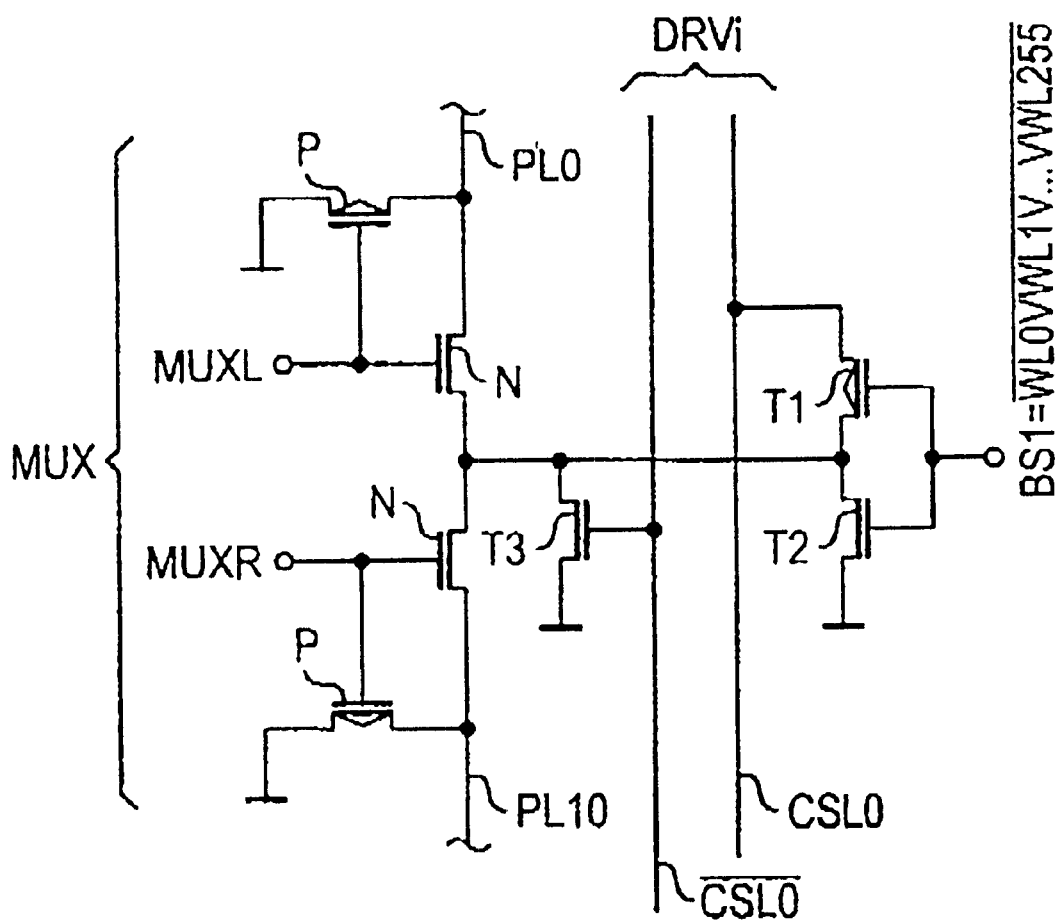
FIG. 6 shows a driver unit with associated multiplexer for the memory of the exemplary embodiment illustrated in FIG. 4.

FIG. 6 shows one of the driver units DRV' which are arranged in the strips designated by DRV in the case of the memory in accordance with FIG. 4. Each of these driver units DRV' is assigned to a plate line segment PL0, PL10 in the two adjacent cell arrays AR0, AR1. The driver unit DRV', which is constructed just like the driver unit DRV10 illustrated in FIG. 2, is connected via a multiplexer MUX to the two plate line segments PL0, PL10 assigned to it. The output of the driver unit DRV', said output being connected to the drains of the first and second transistors T1, T2, is connected to one of the two plate line segments PL0, PL10 via a respective N-channel transistor N. Both plate line segments PL0, PL10 are connected to ground via a respective P-channel transistor P. The gates of the N-channel transistor N and of the P-channel transistor P, which are assigned to the same plate line segment PL0 or PL10, respectively, are connected to one of two control signals MUXL and MUXR assigned to the multiplexer MUX. One of the two plate line segments PL0, PL10 is selected via the control signals MUXL, MUXR, which correspond to a logic OR combination of the word line signals WL0 to WL127 or WL128 to WL255 associated with the respective cell array AR0, AR1. The P-channel transistors P in FIG. 6 ensure that the plate line segment PL0, PL10 not selected in each case has a defined potential (namely ground) even when the associated N-channel transistor N is in the off state.

Figure 5:
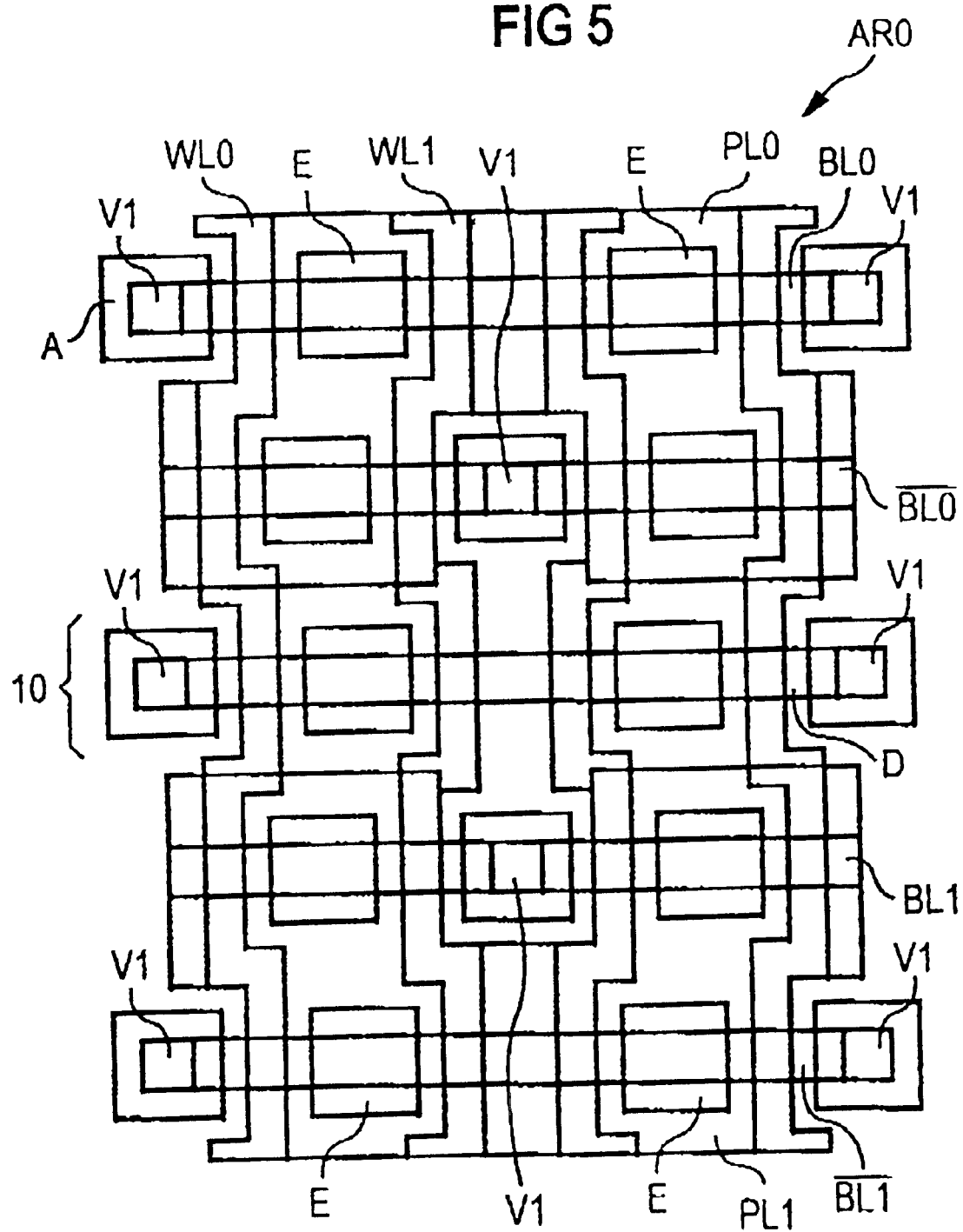
FIG. 5 shows the layout of a plurality of adjacent word lines, bit lines and plate line segments.

FIG. 5 shows the detail of a layout of the cell array AR0 from FIG. 1. The bit lines BLi, the word lines WLi and also the plate line segments PLi are illustrated. The plate line segments PLi are arranged in a first wiring plane made of platinum and run parallel to the bit lines BLi, from left to right in FIG. 5.

The memory is a memory of the "stacked capacitor" type. The plate line segments form the top electrodes of the storage capacitors. The plate line segments PLi are isolated from one another by isolating regions 10, in which there is no platinum in the corresponding wiring plane. The word lines WLi run perpendicularly to the bit lines BLi and the plate line segments PLi, from top to bottom in FIG. 5. While the bit lines BLi are arranged in a second wiring plane of the memory, for example a metalization plane, the word lines WLi run in a third wiring plane, for example a polysilicon plane.

The bit lines BLi are formed by line-shaped structures arranged at regular distances parallel to one another in the second wiring plane. However, not every line-shaped structure forms one of the bit lines BLi. Rather, two of the bit lines BL0, /BL0 and BL1, /BL1, respectively, which form an associated bit line pair are in each case mutually isolated from the adjacent bit line pair by a further one of the line-shaped structures D. This further line-shaped structure D is situated in the second wiring plane parallel to the isolating region 10 arranged in the first wiring plane between the plate line-segments PL0, PL1. The additional line-shaped structure D is a dummy structure, which performs no electrical function within the completed memory.

The bit lines BLi, /BLi in FIG. 5 and also the dummy structures D are arranged, as already mentioned, at regular distances in the second wiring plane. The effect thereby achieved is that these structures can be produced without difficulty, so that the bit lines. can be produced with very great accuracy. In FIG. 5, all that has been illustrated is in each case a bit line pair of two adjacent columns, which are assigned different column addresses. Further bit line pairs of these columns run parallel to the illustrated pairs in the second wiring plane of the memory. The bit lines of each column are mutually isolated from the bit lines of the adjacent columns by a respective dummy structure. The bit lines of each column which are arranged in the second wiring plane are in each case assigned one of the plate line segments running parallel to them in the first wiring plane.

FIG. 5 also shows the bit line contacts V1, via which the bit lines BLi, /Bli are connected to the associated selection transistor T of the memory cell MC. Furthermore, FIG. 5 reveals the bottom electrodes E of the storage capacitors C of the memory cells MC. In this exemplary embodiment, the storage capacitors are realized as stacked capacitors.

It should be noted that, in FIG. 5, the isolating regions 10 between the plate line segments PL0, PL1 have a width which corresponds to one of the line-shaped structures D in the second wiring plane. This makes it possible for the memory to have a very compact construction.

It goes without saying that in other exemplary embodiments of the invention it is also possible to provide more than one dummy structure D between the bit lines of the different columns.

The dummy structures D may be interpreted as "dummy bit lines" and the contacts and diffusions connected to them may be interpreted as "dummy contacts" and "dummy diffusions", respectively, since they have no electrical function.

We claim:

1. An integrated memory, comprising:

word lines, bit lines and plate line segments configured to define crossover points at which said word lines, bit lines, and plate line segments crossover, said bit lines combined to form columns;

memory cells configured at said crossover points, each one of said memory cells including at least one storage capacitor and a selection transistor, said storage capacitor including a first electrode connected to one of said plate line segments, said storage capacitor including a second electrode connected to one of said bit lines by said selection transistor, said selection transistor including a control terminal connected to one of said word lines;

column select lines for selecting said columns of said bit lines;

a column decoder for driving said column select lines as a function of column addresses;

a row decoder for driving said word lines as a function of word addresses;

driver units for connecting said column select lines to said plate line segments, said driver units generating potentials on said plate line segments, said driver units generating said potentials with defined values in specific operating states as a function of a potential of an associated one of said column select lines and as a function of the word addresses.

2. The integrated memory according to claim 1, comprising:

multiplexers, each one of said multiplexers configured between a respectively associated one of said driver units and two respectively associated ones of said plate line segments;

each one of said multiplexers connecting said respective one of said driver units to one of said two respectively associated ones of said plate line segments as a function of the word addresses; and said plate line segments running parallel to said bit lines.

3. The integrated memory according to claim 2, comprising:

inverse column select lines, each one of said inverse column select lines respectively assigned to one of said column select lines and having a potential that is inverted relative to that of said assigned one of said column select lines;

each one of said driver units including a first transistor of a first conduction type, a second transistor of a second conduction type, and a third transistor of the second conduction type;

in each one of said driver units, said first transistor, said second transistor, and said third transistor having a controllable path, a drain, and a control terminal;

in each one of said driver units, said controllable path of said first transistor and said controllable path of said second transistor connected in series between a first potential and said associated one of said column select lines;

each one of said multiplexers having an input;

in each one of said driver units, said drain of said first transistor and said drain of said second transistor connected to said input of said respectively associated one of said multiplexers;

in each one of said driver units, said control terminal of said first transistor and said control terminal of said second transistor receiving a block select signal, said block select signal corresponding to a logic NOR combination of activation signals of a group of said word lines;

in each one of said driver units, said controllable path of said third transistor configured between the first potential and said input of said respectively associated one of said multiplexers, said control input of said third transistor connected to said assigned one of said inverse column select lines.

4. The integrated memory according to claim 1, comprising:

a first wiring plane and a second wiring plane;

isolating regions, said isolating regions and said word lines configured in a direction;

line-shaped structures; and dummy structures that are not connected to any of said memory cells;

said plate line segments configured in said first wiring plane, said plate line segments being isolated from one another by said isolating regions, at least some of said line shaped structures configured parallel to said plate line segments and forming said bit lines;

said second wiring plane including at least some of said line-shaped structures that are configured essentially perpendicularly to said word lines at regular distances from one another; and said dummy structures formed by some of said line-shaped structures that are configured parallel to said isolating regions.

5. The integrated memory according to claim 4, wherein, in each case, for isolating two adjacent groups of ones of said bit lines from one another, a single one of said dummy structures is configured in said second wiring plane and is parallel to one of said isolating regions.

* * * * *